US009336898B2

(12) United States Patent
Kong et al.

(10) Patent No.: US 9,336,898 B2
(45) Date of Patent: May 10, 2016

(54) SHIFT REGISTER UNIT, GATE DRIVER, AND DISPLAY DEVICE (71) Applicants: BOE TECHNOLOGY GROUP CO., LTD., Beijing (CN); HEFEI BOE OPTOELECTRONICS TECHNOLOGY CO., LTD., Hefei (CN)

(72) Inventors: Yi Kong, Beijing (CN); Junhao Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 209 days.

(21) Appl. No.: 14/104,091

(22) Filed: Dec. 12, 2013

(65) Prior Publication Data
US 2014/0169518 A1 Jun. 19, 2014

(30) Foreign Application Priority Data

Dec. 13, 2012 (CN) .......................... 2012 1 0540296

(51) Int. Cl.
G11C 19/00 (2006.01)
G11C 19/28 (2006.01)
G09G 3/36 (2006.01)
G11C 19/18 (2006.01)

(52) U.S. Cl.
CPC .............. *G11C 19/28* (2013.01); *G09G 3/3674* (2013.01); *G11C 19/184* (2013.01); *G09G 2310/0286* (2013.01)

(58) Field of Classification Search
None
See application file for complete search history.

(56) References Cited

U.S. PATENT DOCUMENTS

| 8,548,115 B2* | 10/2013 | Shang ............................. 377/64 |
| 2007/0057899 A1 | 3/2007 | Yamashita |
| 2007/0248204 A1 | 10/2007 | Tobita |
| 2011/0156997 A1 | 6/2011 | Han et al. |
| 2014/0072093 A1* | 3/2014 | Shang et al. ..................... 377/69 |
| 2014/0168049 A1* | 6/2014 | Gu et al. ....................... 345/100 |

FOREIGN PATENT DOCUMENTS

| CN | 1937027 A | 3/2007 |
| CN | 102110420 A | 6/2011 |
| CN | 102708818 A | 10/2012 |

OTHER PUBLICATIONS

Extended European search report issued by the European Patent Office on Mar. 24, 2014 for international patent application No. 13197080.8, 6 pages.

(Continued)

*Primary Examiner* — Tuan T Lam
(74) *Attorney, Agent, or Firm* — Banner & Witcoff, Ltd.

(57) ABSTRACT

Provided are a shift register unit, a gate driver and a display device. The shift register unit comprises: a pull-up control module, a pull-up module, a reset module, and a denoise module for holding a signal output from the first output terminal when the signal has a level higher than a first preset threshold and outputting the held signal from a second output terminal when a signal input from a denoise control signal input terminal has a level higher than a second preset threshold. The signal output from the first output terminal is filtered by using the signal output from the first output terminal and the signal input from the denoise control signal input terminal, and thus burrs in the signal output from the first output terminal are eliminated, that is, noise is eliminated, solving the problem that a defective display picture due to the noise in the output signal.

20 Claims, 8 Drawing Sheets

(56) References Cited

OTHER PUBLICATIONS

English abstract of CN102708818A, listed above, 1 page.
English abstract of CN102110420A, listed above, 2 pages.
English abstract of CN1937027A, listed above, 1 page.
First Office Action (Chinese language) issued by the State Intellectual Property Office ("SIPO") on Nov. 15, 2014 for international application No. 201210540296.7, 6 pages.
English translation of first Office Action (listed above) issued by SIPO for international application No. 201210540296.7, 6 pages.

* cited by examiner

SHIFT REGISTER UNIT, GATE DRIVER, AND DISPLAY DEVICE

CROSS REFERENCE TO RELATED APPLICATIONS

This application claims priority from Chinese National Application No. 201210540296.7 filed on Dec. 13, 2012, the contents of which are incorporated herein by reference.

TECHNICAL FIELD OF THE DISCLOSURE

The present disclosure relates to a technical field of flat panel display, and particularly to a shift register unit, a gate driver and a display device.

BACKGROUND

Flat-panel displays has been developed rapidly due to its advantages of ultra-thin thickness and energy saving. Most of flat-panel displays use a shift register. At present, a shift register implemented by the Gate Driver on Array (GOA) technology can not only be integrated on a gate driver integrated circuit, but also can reduce a manufacturing process during manufacturing of flat-panel display, thus saving production cost. Therefore the GOA technology has been widely used in manufacturing of the flat-panel display in recent years.

Figure 1:
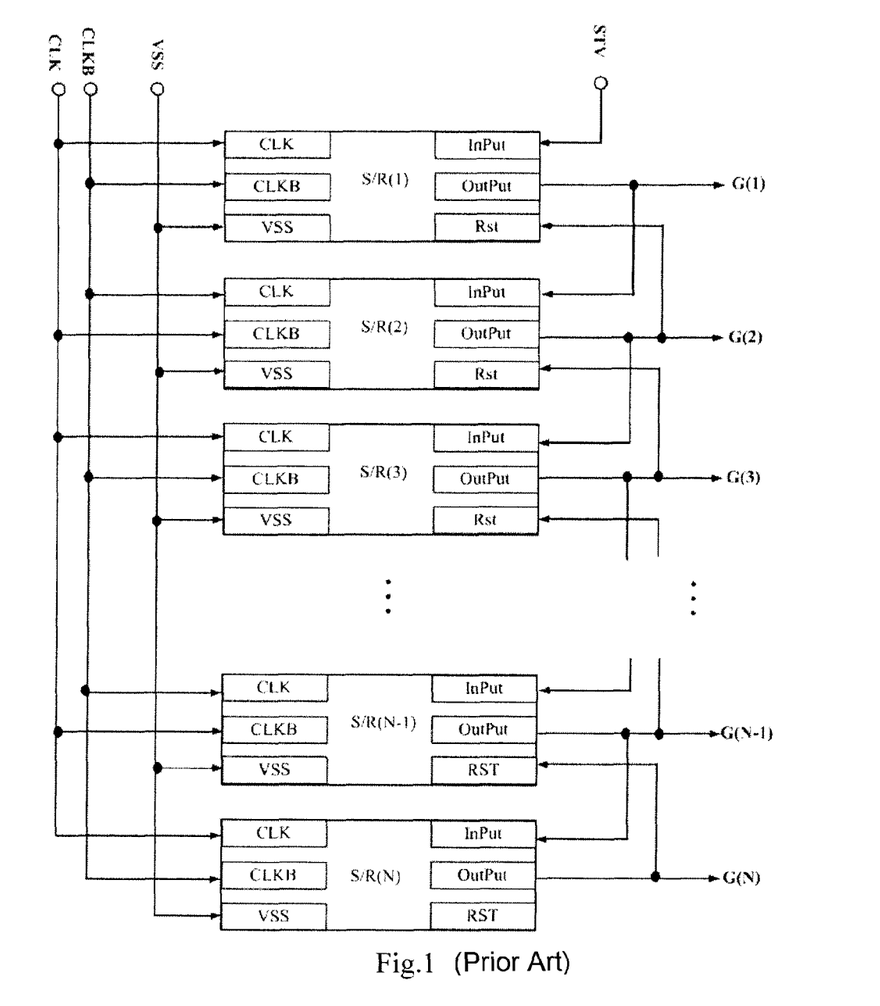
FIG. 1 is a schematic structure diagram of a gate driver in the prior art.
Figure 2:
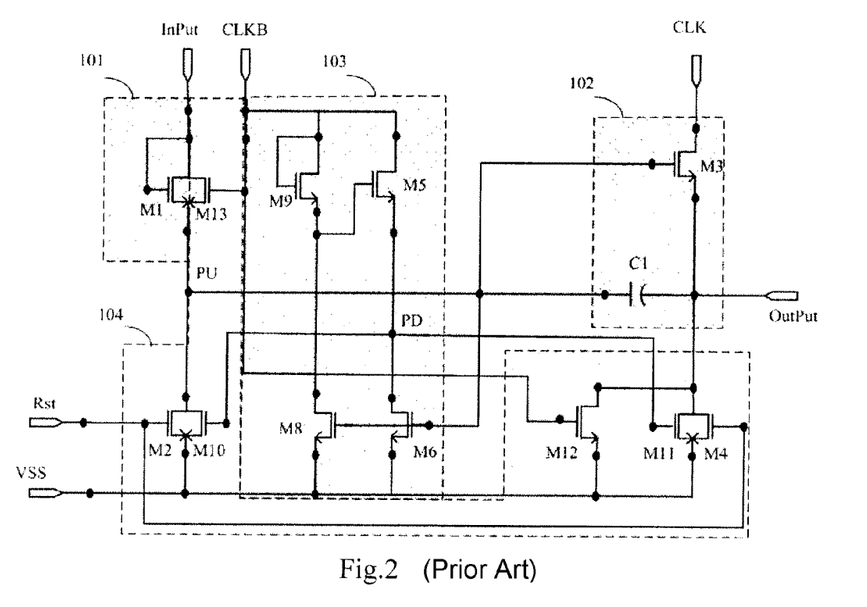
FIG. 2 is a circuit diagram of a shift register unit in the prior art.
Figure 3:
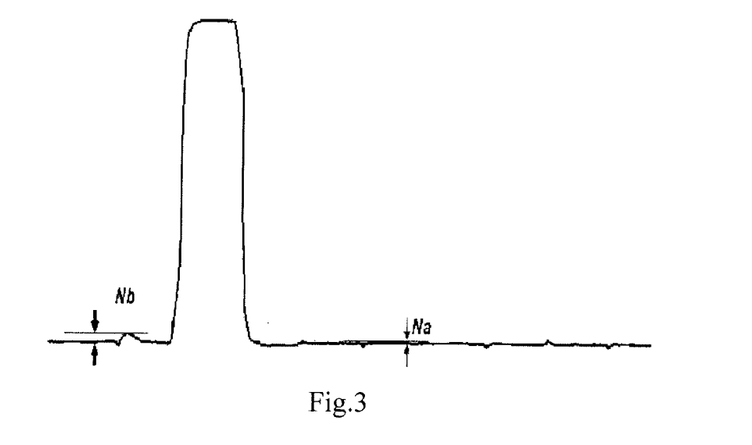
FIG. 3 is a schematic waveform diagram of an output signal of the shift register unit in the prior art.

In an existing GOA design scheme, a schematic diagram of a structure of a gate driver is as shown in FIG. 1, wherein each of shift register units included in the gate driver is a circuit as shown in FIG. 2 and includes a pull-up control module 101, a pull-up module 102, a reset control module 103 and a reset module 104. In particular, the pull-up control module 101 comprises a first transistor M1; the pull-up module 102 includes a third transistor M3 and a first capacitor C1; the reset control module 103 comprises a fifth transistor M5, a sixth transistor M6, an eighth transistor M8 and a ninth transistor M9; the reset module 104 includes a second transistor M2, a fourth transistor M4, a tenth transistor M10, an eleventh transistor M11, a twelfth transistor M12 and a thirteenth transistor M13. However, there is a large parasitic capacitance since the third transistor M3 has a large size (having a channel width of 9000 um); in addition, a waveform with noise (noise after output represented as Na and noise before output represented as Nb) as shown in FIG. 3 is output from the output terminal OutPut, due to the coupling of the first capacitor C1 and a leakage current generated by the transistor connected to the output terminal OutPut when being turned on or off (part of carriers are still moving when the transistor is turned off although the transistor has a turn-on voltage and a turn-off voltage), resulting a defective display picture.

SUMMARY

In embodiments of the present disclosure, there are provided a shift register unit, a gate driver and a display device for solving a problem that a waveform with noise is output from the existing shift register unit and thus results in a defective display picture.

According to one aspect, the embodiments of the present disclosure have the following specific technical solutions.

A shift register unit provided in an embodiment of the present disclosure comprises: a pull-up control module for receiving an input signal and outputting a pull-up control signal to a pull-up node; a pull-up module for providing a signal input from a first clock signal input terminal to a first output terminal according to the pull-up control signal at the pull-up node; a reset module for providing a first power supply voltage to the pull-up node and the first output terminal according to a reset signal; a denoise module for holding a signal output from the first output terminal when the signal has a level higher than a first preset threshold and outputting the held signal output from the first output terminal from a second output terminal when a signal input from a denoise control signal input terminal has a level higher than a second preset threshold.

According to another aspect, a gate driver provided in an embodiment of the present disclosure includes a plurality of above shift register units, wherein except for a first shift register unit and a last shift register unit, a first output terminal of each of the shift register units is connected to a reset signal input terminal of an adjacent previous shift register unit and an input terminal of an adjacent next shift register unit, and the gate driver outputs output signals of second output terminals of the respective shift register units sequentially; a first output terminal of the first shift register unit is connected to an input terminal of a second shift register unit, and a first output terminal of the last shift register unit is connected to a reset signal input terminal of an adjacent previous shift register unit; and an input terminal of the first shift register unit inputs a frame start signal.

According to still another aspect, a display device provided in embodiments of the present disclosure comprises the above gate driver.

With the embodiments of the present disclosure, since a denoise module is added in the shift register unit and is used for holding a signal output from the first output terminal when the signal has a level higher than the first preset threshold and outputting the held signal output from the first output terminal from the second output terminal when a signal input from the denoise control signal input terminal has a level higher than the second preset threshold, the purpose of removing noise in the signal output from the first output terminal can be achieved, reducing noise in the signal output to a gate line connected to the second output terminal. Therefore, with the shift register unit in the embodiments of the present disclosure, the problem that a defective display picture due to noise in the output signal can be solved.

DETAILED DESCRIPTION

Below, specific implementations of a shift register unit, a gate driver and a display device provided in embodiments of the present disclosure will be described with reference to with the accompanying drawings.

First Embodiment

Figure 4:
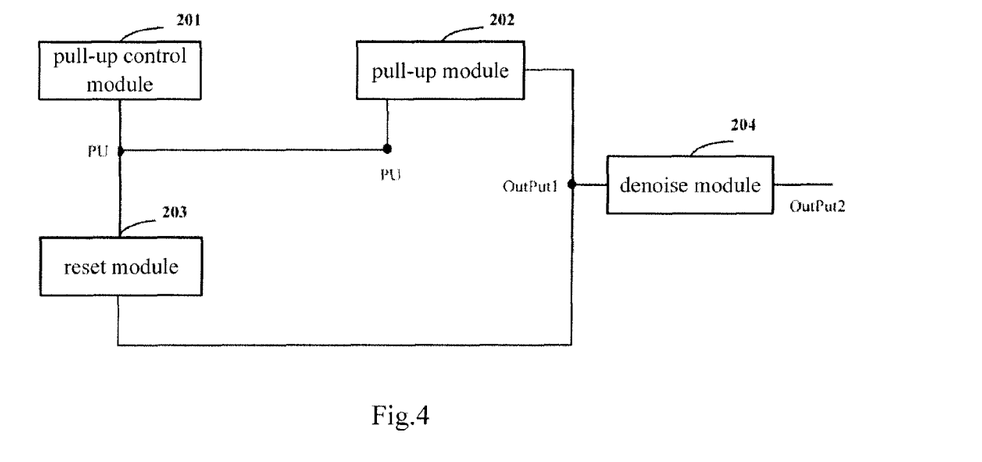
FIG. 4 is a schematic structure diagram of a shift register unit in a first embodiment of the present disclosure.

A schematic structure diagram of a shift register unit in a first embodiment of the present disclosure is as shown in FIG. 4, and the shift register unit comprises: a pull-up control module 201, a pull-up module 202, a reset module 203 and a denoise module 204.

The pull-up control module 201 is used for receiving an input signal and outputting a pull-up control signal to a pull-up node.

The pull-up module 202 is used for providing a signal input from a first clock signal input terminal to a first output terminal according to the pull-up control signal at the pull-up node.

The reset module 203 is used for providing a first power supply voltage to the pull-up node and the first output terminal according to a reset signal.

The denoise module 204 is used for holding a signal output from the first output terminal when the signal has a level higher than a first preset threshold and outputting the held signal output from the first output terminal from a second output terminal when a signal input from a denoise control signal input terminal has a level higher than a second preset threshold.

The first preset threshold and the second preset threshold may be determined based on experience.

Figure 5:
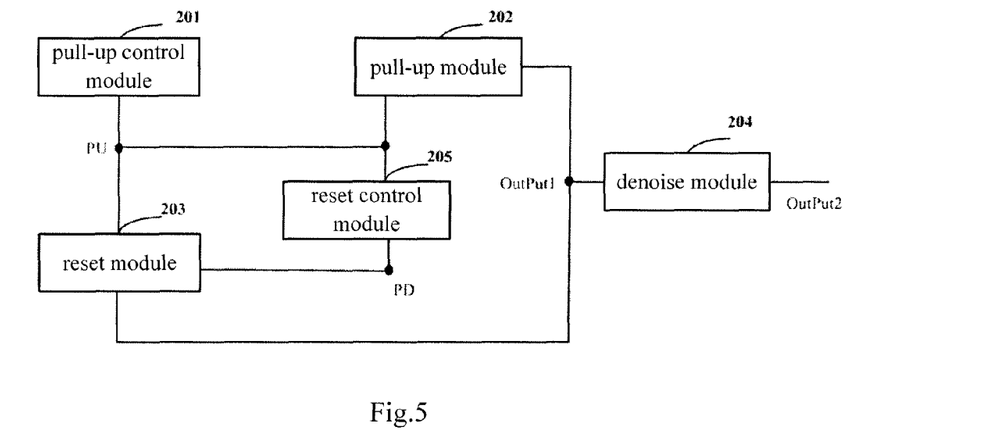
FIG. 5 is a schematic structure diagram of the shift register unit in the first embodiment of the present disclosure.

In the first embodiment, the shift register unit further comprises a reset control module 205, and a schematic structure diagram of the shift register unit comprising the reset control module 205 is as shown in FIG. 5.

The reset control module 205 is used for outputting a reset control signal to the reset module according to a signal input from a second clock signal input terminal and the pull-up control signal, wherein the signal input from the first clock signal input terminal and the signal input from the second clock signal input terminal have opposite phases.

The reset module 203 is specifically used for providing the first power supply voltage to the pull-up node and the first output terminal according to the signal input from the second clock signal input terminal, the reset signal and the reset control signal at a reset control node.

Figure 6:
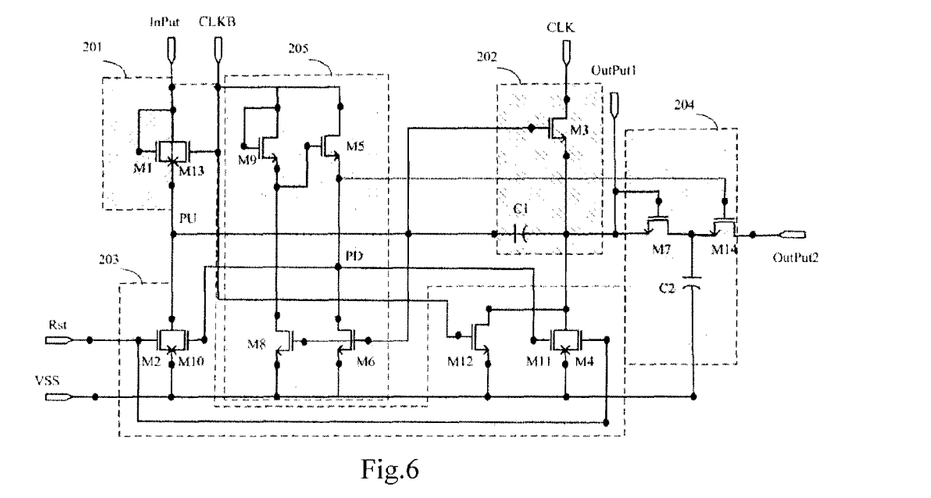
FIG. 6 is a circuit diagram of the shift register unit in the first embodiment of the present disclosure.

The denoise control signal input terminal in the shift register unit in the first embodiment of the present disclosure as shown in FIG. 4 or FIG. 5 may be connected to the second clock signal input terminal, wherein the signal input from the second clock signal input terminal and the signal input from the first clock signal input terminal have opposite phases, and a specific circuit may be as shown in FIG. 6.

The pull-up control module 201 includes a first transistor M1, which has a control terminal and a first terminal receiving the input signal together, and a second terminal connected to the pull-up node PU.

The pull-up module 202 comprises: a third transistor M3 and a first capacitor C1, wherein the third transistor M3 has a control terminal connected to the PU node, a first terminal receiving the first clock signal, and a second terminal connected to the first output terminal; and the first capacitor C1 has one terminal connected to the PU node and the other terminal connected to the first output terminal.

The reset control module 205 comprises: a fifth transistor M5, a sixth transistor M6, an eighth transistor M8 and a ninth transistor M9.

The fifth transistor M5 has a control terminal connected to a second terminal of the ninth transistor M9, a first terminal receiving a second clock signal, and a second terminal connected to a reset control node PD.

The sixth transistor M6 has a control terminal connected to the PU node, a first terminal connected to the PD node, and a second terminal receiving a first power supply voltage VSS.

The eighth transistor M8 has a control terminal connected to the PU node, a first terminal connected to the second terminal of the ninth transistor M9, and a second terminal receiving the first power supply voltage VSS.

The ninth transistor M9 has a control terminal and a first terminal receiving the second clock signal together.

The reset module 203 comprises: a second transistor M2, a fourth transistor M4, a tenth transistor M10, an eleventh transistor M11, a twelfth transistor M12 and a thirteenth transistor M13.

The second transistor M2 has a control terminal receiving the reset signal, a first terminal connected to the PU node, and a second terminal receiving VSS.

The fourth transistor M4 has a control terminal receiving the reset signal, a first terminal connected to the first output terminal, and a second terminal receiving VSS.

The tenth transistor M10 has a control terminal connected to the PD node, a first terminal connected to the PU node, and a second terminal receiving VSS.

The eleventh transistor M11 has a control terminal connected to the PD node, a first terminal connected to the first output terminal, and a second terminal receiving VSS.

The twelfth transistor M12 has a control terminal receiving the second clock signal, a first terminal connected to the first output terminal, and a second terminal receiving VSS;

The thirteenth transistor M13 has a control terminal connected to the second clock signal, a first terminal receiving the input signal, and a second terminal connected to the PU node.

The denoise module 204 comprises: a seventh transistor M7, a fourteenth transistor M14 and a second capacitor C2.

The seventh transistor M7 has a control terminal and a first terminal connected to the first output terminal together, and a second terminal connected to a first terminal of the fourteenth transistor.

The fourteenth transistor M14 has a control terminal connected to PD node and a second terminal connected to the second output terminal.

The second capacitor C2 has one terminal receiving VSS and the other terminal connected to the second terminal of the seventh transistor M7.

For the circuit as shown in FIG. 6, the control terminal of M14 in the denoise module can receive the second clock signal, instead of being connected to the PD node, and the rest of the connection relationship keeps unchanged.

The denoise module in the embodiment of the present disclosure is used for holding the signal output from the first output terminal when the signal has a level higher than the first preset threshold and outputting the held signal output from the first output terminal from the second output terminal when the signal input from the denoise control signal input terminal has a level higher than the second preset threshold. The voltage output from the second output terminal of the denoise module keeps substantially constant through charging and discharging of the capacitor, such that it can be well ensured that the second output terminal of the denoise module in the shift register unit connected to the gate line can output a stable signal.

The first preset threshold and the second preset threshold may be determined based on experience.

For example, the first preset threshold may be set as a turn-on threshold voltage of the seventh transistor M7 and the second preset threshold may be set as a turn-on threshold voltage of the fourteenth transistor M14.

In the embodiment of the present disclosure, for each transistor, the connection relationship of the first terminal and the connection relationship of the second terminal are interchangeable, therefore a first terminal of a transistor mentioned in the embodiment of the present disclosure may be a drain of the transistor or may be a source of the transistor, and a second terminal of a transistor mentioned in the embodiment of the present disclosure may be a drain of the transistor or may be a source of the transistor. The first terminals of the above fourteen transistors are not necessary to be sources or drains at the same time, and the second terminals of the above fourteen transistors are not necessary to be sources or drains at the same time, that is, the first terminals of any t transistors in the first to fourteenth transistors are drains and the second terminals thereof are sources, and the first terminals of the other (14−t) transistors in the first to fourteenth transistors are sources and the second terminals thereof are drains, wherein $0 \leq t \leq 14$.

Figure 7:
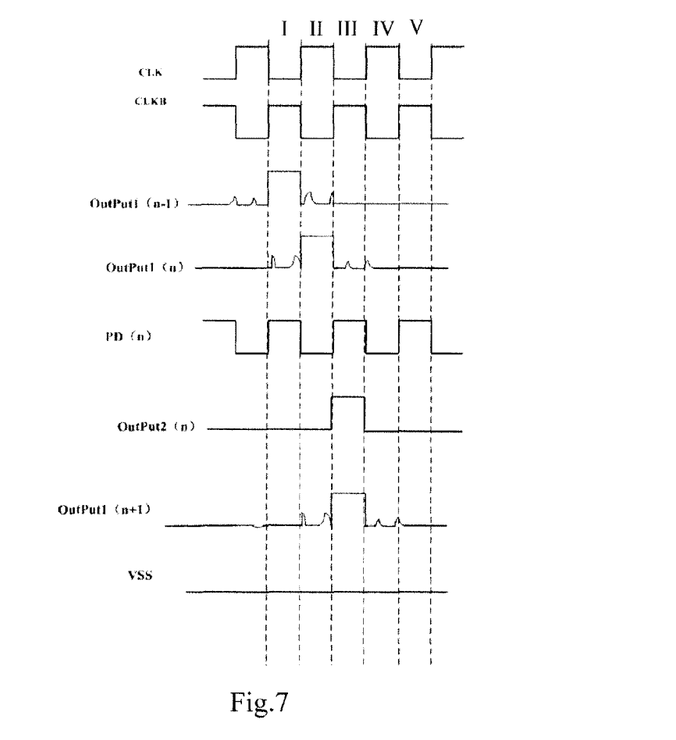
FIG. 7 is a schematic diagram of an operational timing sequence of the shift register unit in the first embodiment of the present disclosure.

Below, the circuit of the shift register unit as shown in FIG. 6 is taken as an example and descriptions are given to the operational principle of the first embodiment of the present disclosure with reference to the diagram of the scanning timing sequence as shown in FIG. 7, so as to make the operational principle more clear.

A schematic diagram of the scanning timing sequence of the shift register unit provided in the first embodiment of the present disclosure is as shown in FIG. 7.

Wherein CLK is the first clock signal input to a shift register unit S/R(n); CLKB is the second clock signal input to the shift register unit S/R(n); OutPut1(n−1) is the output signal of the first output terminal of a shift register unit S/R(n−1) previously adjacent to the shift register unit S/R(n) and is used as the input signal of the shift register unit S/R(n); PD(n) is the reset control signal output from the reset control module of the shift register unit S/R(n); OutPut1(n) is the output signal of the first output terminal of the shift register unit S/R(n); OutPut2(n) is the output signal of the second output terminal of the shift register unit S/R(n); VSS is the power supply voltage input to the shift register unit S/R(n) and is a low level signal.

The scanning timing sequence process of the shift register unit S/R(n) can be divided into the following five phases, and particularly I, II, III, IV and V in FIG. 7 represent time periods of the five phases respectively.

Since the denoise module in the circuit as shown in FIG. 6 operates under the control of the level of the PD node and the level of the output signal OutPut1(n), the denoising principle of the circuit as shown in FIG. 6 is analyzed by directly using the level of the PD node PD(n) and the level of the output signal OutPut1(n) in the first embodiment of the present disclosure.

In a first phase, that is, in a first half cycle of a first clock cycle, the shift register unit S/R(n) receives a high level signal of OutPut1(n−1) output from the terminal OutPut1 of S/R(n−1), M14 is turned on since the PD node provides a high level signal at this time; M7 is turned off since the terminal OutPut1 of S/R(n) outputs a low level signal; in this phase, even if a signal OutPut1(n) with noise is output from the terminal OutPut1 of S/R(n), a low level signal without noise can be output from the terminal OutPut2 of S/R(n) since M7 is turned off, and particularly OutPut2(n) is a low level signal without noise in this phase, as shown in FIG. 7.

In this phase, M7 cannot be turned on even if there is noise with a relative low magnitude, ensuring in turn that a low level signal without noise is output from the terminal OutPut2 of S/R(n); especially when the control terminal of M7 is connected to the second terminal (drain) of M3, it can be further ensured that M7 cannot be turned on since M3 is not turned on in this phase, such that the output signal at the terminal OutPut2 of S/R(n) will not be affected even if the output signal at the terminal OutPut1 has noise. In addition, with increase of the voltage at the PU node, M6 and M8 are turned on, and the voltage at the PD node keeps at a low level and M5 is turned off, so that M14 changes to be turned off from being on. That is, in this phase, even if the output signal at the terminal OutPut1 has noise, the noise may be at most stored in the capacitor C2, such that it can be further ensured that the terminal OutPut2 of S/R(n) outputs a low level signal without noise.

In a second phase, that is, in a second half cycle of the first clock cycle, the input signal input to S/R(n) is a low level signal (that is, the low level signal of OutPut1(n−1) in this phase) and the terminal OutPut1 of S/R(n) outputs a high level signal (that is, the high level signal OutPut1(n) in this phase), M7 is turned on and C2 is charged, such that the voltage across two terminals of C2 rises; in addition, the PD node provides a low level signal in this phase (that is, PD(n) is a low level signal in this phase) and M14 is turned off, a low level signal without noise can be output from the terminal OutPut2 of S/R(n), and particularly OutPut2(n) is a low level signal without noise in this phase, as shown in FIG. 7.

In a third phase, that is, in a first half cycle of a second clock cycle, the reset signal input to S/R(n) is a high level signal (that is, OutPut1(n+1) output from the terminal OutPut1 of S/R(n+1) is a high level signal in this phase), and OutPut1(n) output from the terminal OutPut1 of S/R(n) is a low level signal in this phase, M7 is turned off; even if the low level signal of OutPut1(n) has noise in this phase, such noise will not be outputted to the terminal OutPut2 of S/R(n) since M7 is turned off; the PD node provides a high level signal in this phase (that is, PD(n) is a high level signal in this phase), M14 is turned on and C2 is discharged, and thus a high level signal without noise can be output from the terminal OutPut2 of S/R(n), and particularly OutPut2(n) is a high level signal without noise in this phase, as shown in FIG. 7.

In a fourth phase, that is, in a second half cycle of the second clock cycle, OutPut1(n) output from the terminal OutPut1 of S/R(n) is a low level signal in this phase, M7 is turned off; even if the low level signal of OutPut1(n) has noise in this phase, such noise will not be outputted to the terminal OutPut2 of S/R(n) since M7 is turned off; the PD node provides a low level signal in this phase (that is, PD(n) is a low level signal in this phase), M14 is turned off and C2 is at a low level in this fourth phase since it has been discharged in the above third phase, and thus a low level signal without noise can be output from the terminal OutPut2 of S/R(n), and particularly OutPut2(n) is a low level signal without noise in this phase, as shown in FIG. 7.

In a fifth phase, that is, in a first half cycle of a third clock cycle, OutPut1(n) output from the terminal OutPut1 of S/R(n) is a low level signal in this phase, M7 is turned off; even if the low level signal of OutPut1(n) has noise in this phase, such noise will not be outputted to the terminal OutPut2 of S/R(n) since M7 is turned off; the PD node provides a high level signal in this phase (that is, PD(n) is a high level signal in this phase), M14 is turned on, and thus a low level signal without noise can be output from the terminal OutPut2 of S/R(n) since the voltage across two terminals of C2 still maintains low, and particularly OutPut2(n) is a low level signal without noise in this phase, as shown in FIG. 7.

Then, the fourth phase and the fifth phase are sequentially repeated, and until the shift register unit S/R(n) receives a high level signal of OutPut1(n−1) output from the terminal OutPut1 of S/R(n−1), the first phase is performed again.

As seen from the schematic diagram of the timing sequence as shown in FIG. 7, variation of the level of the PD node is same as that of the level of CLKB, and thus the control terminal of M14 in FIG. 6 can also receive CLKB, and the denoise effect can also be achieved.

Seen from the above analysis, in the shift register unit in the first embodiment of the present disclosure, the output signal of the first output terminal and the reset control signal (that is, the signal at the PD node) are used to control turning-on or turning-off of M7 and M14 in the denoise module respectively, and charging and discharging of the capacitor in the denoise module are used to remove noise in the output signal at the first output terminal of the shift register unit, removing jagged noise and in turn ensuring display quality of a picture.

Second Embodiment

The operational principle of the shift register unit having the structure as shown in FIG. 5 in the first embodiment can also be applied to a second embodiment of the present disclosure. Below, a detailed description will be made.

Based on the structure of the shift register unit as shown in FIG. 4, the shift register unit further comprises a reset control module 205, and a schematic structure diagram of the shift register unit comprising the reset control module 205 is same as FIG. 5.

The reset control module 205 is used for outputting a reset control signal to the reset module according to a second power supply voltage and the pull-up control signal.

The reset module 203 is specifically used for providing the first power supply voltage to the pull-up node and the first output terminal according to the reset signal and the reset control signal.

Figure 8:
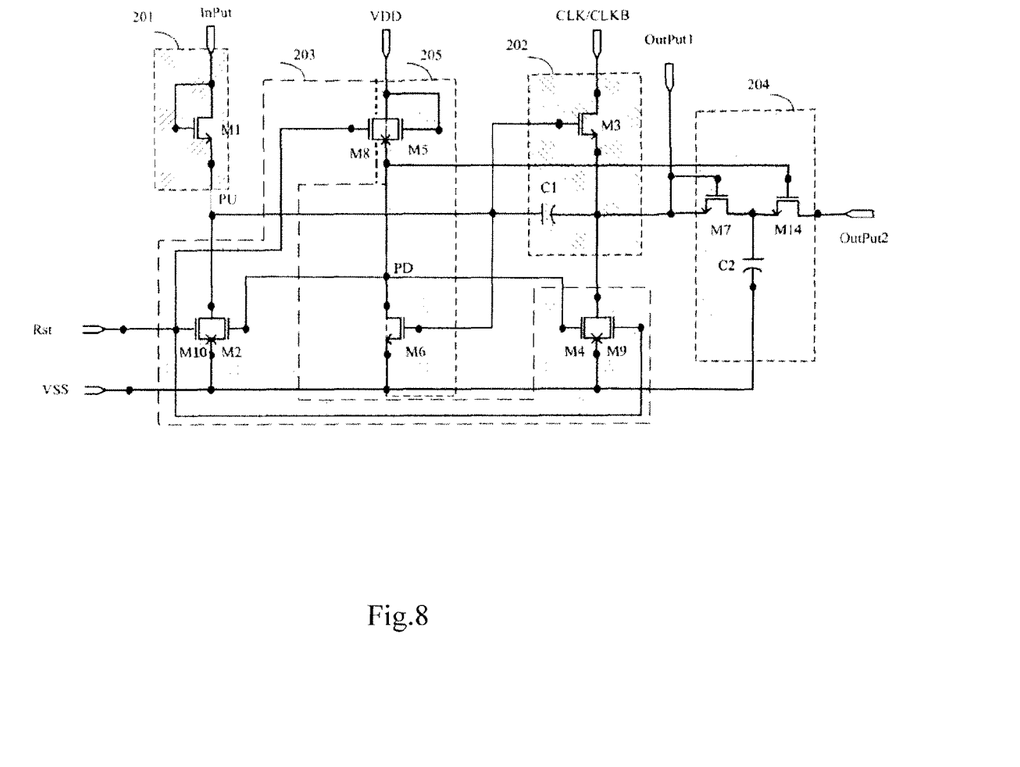
FIG. 8 is a circuit diagram of the shift register unit in a second embodiment of the present disclosure.

The specific circuit of the shift register unit with the operational principle described in the second embodiment of the present disclosure may be as shown in FIG. 8.

The pull-up control module 201 includes a first transistor M1, which has a control terminal and a first terminal connected together for receiving the input signal, and a second terminal connected to the PU node.

The pull-up module 202 comprises: a third transistor M3 and a first capacitor C1, wherein the third transistor M3 has a control terminal connected to the PU node, a first terminal receiving a corresponding clock signal, and a second terminal connected to the first output terminal; and the first capacitor C1 has one terminal connected to the PU node and the other terminal connected to the first output terminal.

The reset control module 205 comprises a fifth transistor M5 and a sixth transistor M6. The fifth transistor M5 has a control terminal and a first terminal connected together for receiving a second power supply voltage VDD, and a second terminal connected to the PD node. The sixth transistor M6 has a control terminal connected to the PU node, a first terminal connected to the PD node, and a second terminal receiving VSS.

The reset module 203 comprises: a second transistor M2, a fourth transistor M4, a tenth transistor M10, an eighth transistor M8, and a ninth transistor M9. The second transistor M2 has a control terminal connected to the PD node, a first terminal connected to the PU node, and a second terminal receiving VSS. The fourth transistor M4 has a control terminal connected to the PD node, a first terminal connected to the first output terminal, and a second terminal receiving VSS. The tenth transistor M10 has a control terminal receiving the reset signal, a first terminal connected to the PU node, and a second terminal receiving VSS. The eighth transistor M8 has a control terminal receiving the reset signal, a first terminal receiving VDD, and a second terminal connected to the PD node. The ninth transistor M9 has a control terminal receiving the reset signal, a first terminal connected to the first output terminal, and a second terminal receiving VSS.

The denoise module 204 comprises: a seventh transistor M7, a fourteenth transistor M14 and a second capacitor C2. The seventh transistor M7 has a control terminal and a first terminal connected to the first output terminal together and a second terminal connected to a first terminal of the fourteenth transistor. The fourteenth transistor M14 has a control terminal connected to PD node and a second terminal connected to the second output terminal. The second capacitor C2 has one terminal receiving VSS and the other terminal connected to the second terminal of the seventh transistor M7.

For the circuit as shown in FIG. 8, the control terminal of M14 in the denoise module can receive a clock signal having opposite phase to the corresponding clock signal, instead of being connected to the PD node, and the rest of the connection relationship keep unchanged.

Figure 9:
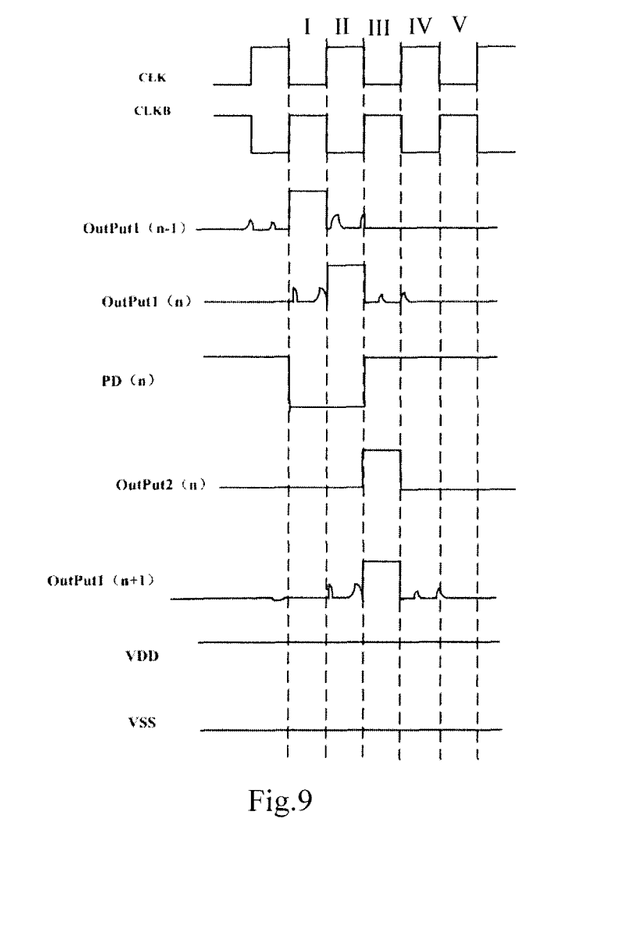
FIG. 9 is a schematic diagram of an operational timing sequence of the shift register unit in the second embodiment of the present disclosure.

Below, the circuit of the shift register unit as shown in FIG. 8 is taken as an example and descriptions are given to the operational principle of the second embodiment of the present disclosure with reference to the diagram of the scanning timing sequence as shown in FIG. 9, so as to make the operational principle more clear.

A schematic diagram of the scanning timing sequence of the shift register unit provided in the second embodiment of the present disclosure is as shown in FIG. 9.

CLK is the clock signal input to a shift register unit S/R(n); CLKB is the clock signal input to the shift register unit S/R(n−1) and the shift register unit S/R(n+1); OutPut1(n−1) is the output signal of the first output terminal of a shift register unit S/R(n−1) previously adjacent to the shift register unit S/R(n) and is used as the input signal of the shift register unit S/R(n); PD(n) is the reset control signal output from the reset control module of the shift register unit S/R(n); OutPut1(n) is the output signal of the first output terminal of the shift register unit S/R(n); OutPut2(n) is the output signal of the second output terminal of the shift register unit S/R(n); VSS is the first power supply voltage input to the shift register unit S/R(n) and is a low level signal; VDD is the second power supply voltage input to the shift register unit S/R(n) and is a high level signal.

The scanning timing sequence of the shift register unit S/R(n) can be divided into the following five phases, and particularly I, II, III, IV and V in FIG. 9 represent time periods of the five phases respectively.

Since the denoise module in the circuit as shown in FIG. 8 operates under the control of the level of the PD node and the level of the output signal OutPut1(n), the denoise principle of the circuit as shown in FIG. 8 is analyzed by directly using the level PD(n) of the PD node and the level of the output signal OutPut1(n) of the terminal Output1 in the second embodiment of the present disclosure.

In a first phase, that is, in a first half cycle of a first clock cycle, the shift register unit S/R(n) receives a high level signal of OutPut1(n−1) output from the terminal OutPut1 of S/R(n−1), M14 is turned off since the PD node is at a low level at this time; M7 is turned off since the terminal OutPut1 of S/R(n) outputs a low level signal; in this phase, even if a signal OutPut1(n) with noise is output from the terminal OutPut1 of S/R(n), a low level signal without noise is output from the terminal OutPut2 of S/R(n) since M7 is turned off, and particularly OutPut2(n) is a low level signal without noise in this phase, as shown in FIG. 9.

In a second phase, that is, in a second half cycle of the first clock cycle, the input signal input to S/R(n) is a low level signal (that is, the low level signal of OutPut1(n−1) in this phase) and the terminal OutPut1 of S/R(n) outputs a high level signal (that is, OutPut1(n) is a high level signal in this phase), M7 is turned on and C2 is charged, such that the voltage across two terminals of C2 rises; in addition, the PD node provides a low level signal in this phase (that is, PD(n) is a low level signal in this phase) and M14 is turned off, a low level signal without noise is output from the terminal OutPut2 of S/R(n), and particularly OutPut2(n) is a low level signal without noise in this phase, as shown in FIG. 9.

In a third phase, that is, in a first half cycle of a second clock cycle, the reset signal input to S/R(n) is a high level signal (that is, OutPut1(n+1) output from the terminal OutPut1 of S/R(n+1) is a high level signal in this phase), and OutPut1(n) output from the terminal OutPut1 of S/R(n) is a low level signal in this phase, M7 is turned off; even if the low level signal of OutPut1(n) has noise in this phase, such noise will not be outputted to the terminal OutPut2 of S/R(n) since M7 is turned off; the PD node provides a high level signal in this phase (that is, PD(n) is a high level signal in this phase), M14 is turned on and C2 is discharged, and thus a high level signal without noise is output from the terminal OutPut2 of S/R(n), and particularly OutPut2(n) is a high level signal without noise in this phase, as shown in FIG. 9.

In a fourth phase, that is, in a second half cycle of the second clock cycle, OutPut1(n) output from the terminal OutPut1 of S/R(n) is a low level signal in this phase, M7 is turned off; even if the low level signal of OutPut1(n) has noise in this phase, such noise will not be outputted to the terminal OutPut2 of S/R(n); the PD node provides a high level signal in this phase (that is, PD(n) is a high level signal in this phase), M14 is turned on and C2 is at a low level in this fourth phase since it has been discharged in the above third phase, and thus a low level signal without noise is output from the terminal OutPut2 of S/R(n), and particularly OutPut2(n) is a low level signal without noise in this phase, as shown in FIG. 9.

In a fifth phase, that is, in a first half cycle of a third clock cycle, OutPut1(n) output from the terminal OutPut1 of S/R(n) is a low level signal in this phase, M7 is turned off; even if the low level signal of OutPut1(n) has noise in this phase, such noise will not be outputted to the terminal OutPut2 of S/R(n) since M7 is turned off; the PD node provides a high level signal in this phase (that is, PD(n) is a high level signal in this phase), M14 is turned on, and thus a low level signal without noise is output from the terminal OutPut2 of S/R(n) since the voltage across two terminals of C2 still maintains low, and particularly OutPut2(n) is a low level signal without noise in this phase, as shown in FIG. 9.

Then, the fourth phase and the fifth phase are sequentially repeated, and until the shift register unit S/R(n) receives a high level signal of OutPut1(n−1) output from the terminal OutPut1 of S/R(n−1), the first phase is performed again.

Seen from the above analysis on the schematic diagram of the timing sequence as shown in FIG. 9, the control terminal of M14 in FIG. 8 can be separately connected to a separate signal, and a control signal for turning on M14 is only provided in the time period (for example, the third phase) in which M14 is required to be turned on; and the control terminal of M14 in FIG. 8 can also receive a clock signal having an opposite phase to the corresponding clock signal (particularly, CLK in FIG. 8), and noise in the output signal of the first output terminal may also be removed, achieving the same denoise effect.

Third Embodiment

Figure 10:
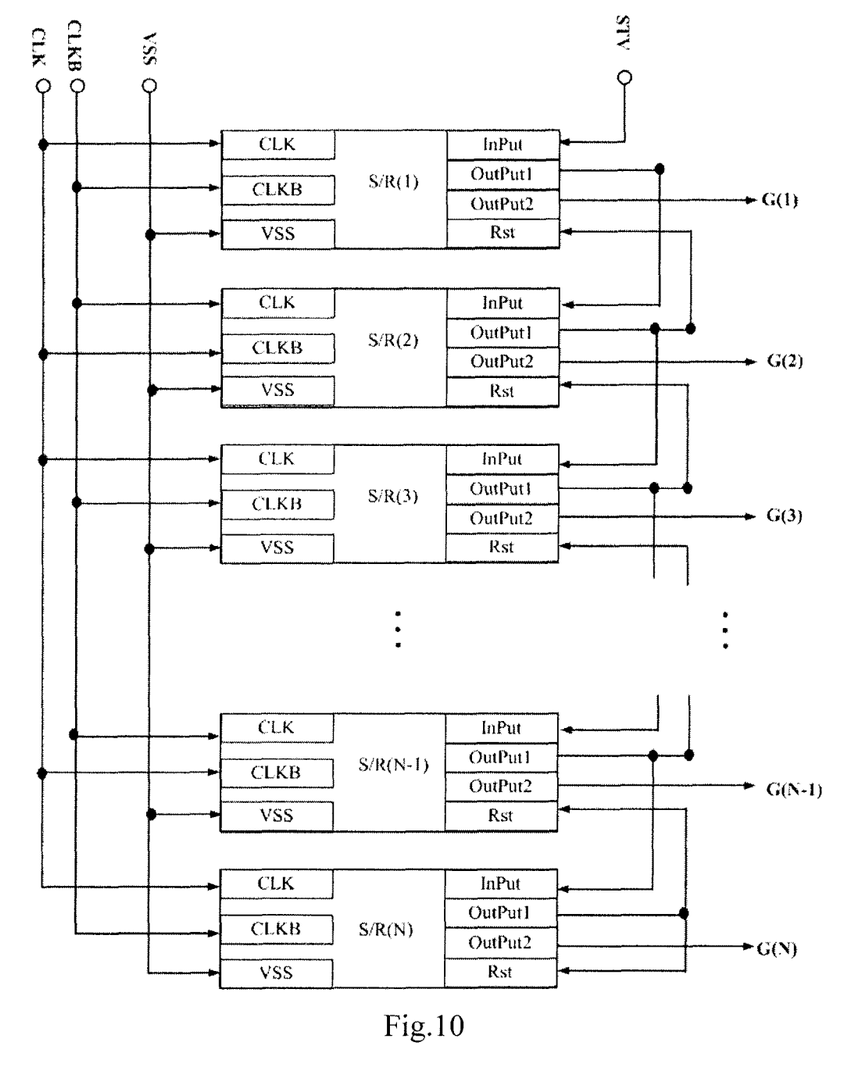
FIG. 10 is a schematic structure diagram of a gate driving circuit in a third embodiment of the present disclosure.

Based on a same inventive concept as that of the first embodiment of the present disclosure, there is provided a gate driver in a third embodiment of the present disclosure, a schematic structure diagram of the gate driver is as shown in FIG. 10. The gate driver comprises a plurality of shift register units as described in the first embodiment of the present disclosure, that is, total N shift register units including S/R(1), S/R(2), . . . , S/R(N), wherein except for a first shift register unit and a last shift register unit, a first output terminal of each of the shift register units is connected to a reset signal input terminal of an adjacent previous shift register unit and an input terminal of an adjacent next shift register unit, and the gate driver outputs output signals of second output terminals of the respective shift register units sequentially; a first output terminal of the first shift register unit is connected to an input terminal of a second shift register unit, and a first output terminal of the last shift register unit is connected to a reset signal input terminal of an adjacent previous shift register unit; and an input terminal of the first shift register unit inputs a frame start signal.

For an odd-numbered shift register unit, a first clock signal input terminal inputs a first clock signal and a second clock signal input terminal inputs a second clock signal. For an even-numbered shift register unit, a first clock signal input terminal inputs the second clock signal and a second clock signal input terminal inputs the first clock signal.

The first power supply voltage VSS is input to the respective shift register units through the first power supply voltage VSS input terminal.

The first clock signal CLK, the second clock signal CLKB and VSS are signals for ensuring that the shift register units can operate normally, and CLK and CLKB have opposite phases.

In an example, the gate driver outputs output signals of the second output terminals of the respective shift register units sequentially, and the second output terminals of the respective shift register units are connected to gate lines of a display device, respectively.

In an example, the first output terminal of the last shift register unit is connected to the reset signal input terminal of its adjacent previous shift register unit and the reset signal input terminal itself.

In the technical solution of the third embodiment of the present disclosure, since a denoise module is newly added in each of the shift register units and removes noise in the signal output from the first output terminal according to the reset control signal and the signal output from the first output terminal, such that denoising the signal output from the first output terminal may be achieved, and thus noise in signals output from the second output terminals of the respective shift register units to the corresponding gate lines respectively are reduced, rendering improvement of display quality of a picture.

Fourth Embodiment

Figure 11:
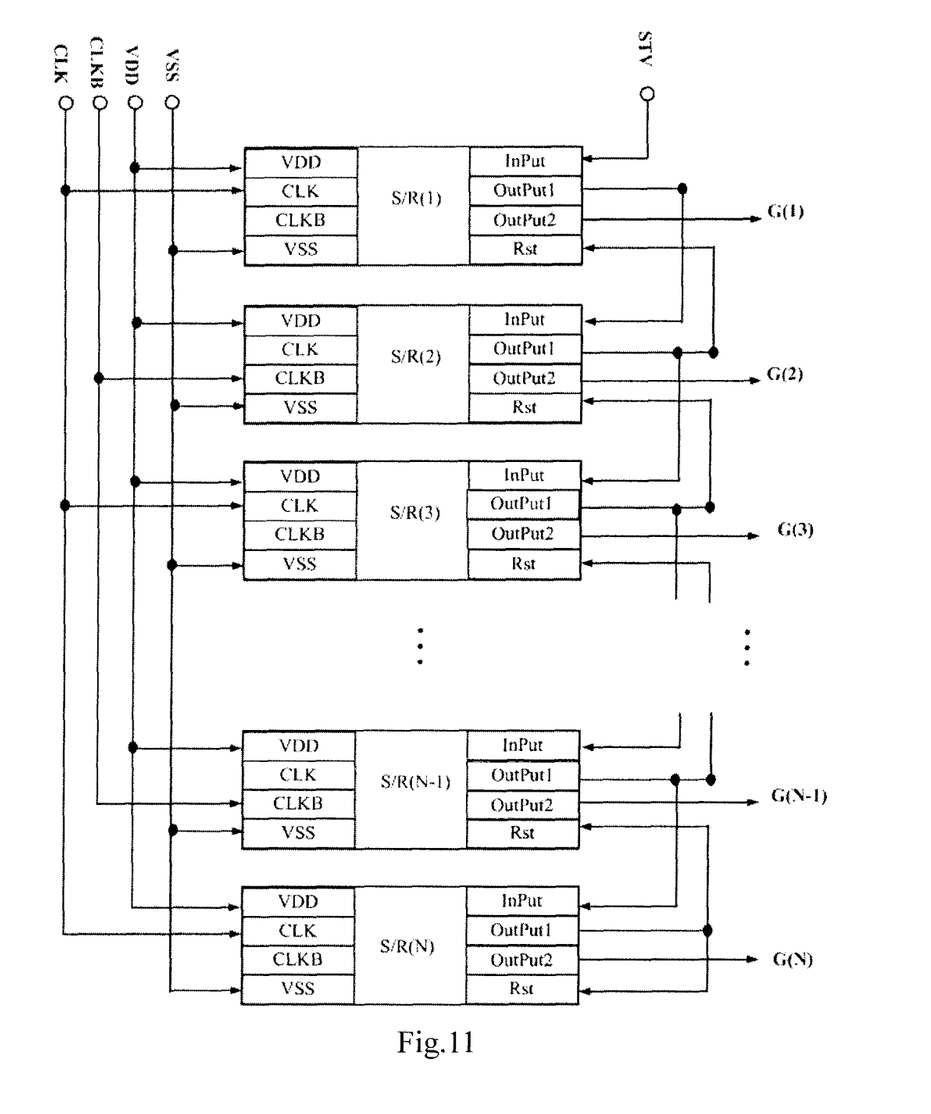
FIG. 11 is a schematic structure diagram of a gate driving circuit in a fourth embodiment of the present disclosure.

Based on a same inventive concept as that of the second embodiment of the present disclosure, there is provided a gate driver in a fourth embodiment of the present disclosure, a schematic structure diagram of the gate driver is as shown in FIG. 11. The gate driver comprises a plurality of shift register units, that is, total N shift register units including S/R(1), S/R(2), ..., S/R(N), wherein a frame start signal STV is input to an input terminal of a first shift register unit, a first output terminal OutPut1 of each of the rest of shift register units S/R(n) is connected to an input terminal InPut of its adjacent next shift register unit S/R(n+1) and a reset signal input terminal Rst of its adjacent previous shift register unit S/R(n−1), and a second output terminal OutPut2 of each of shift register units is connected to a corresponding gate line G(n), wherein n is a positive integer greater than 1 and less than N.

In the plurality of shift register units, there are odd-numbered shift register units receiving a first clock signal and even-numbered shift register units receiving a second clock signal having an opposite phase to that of the first clock signal.

Each of the odd-numbered shift register units receives the first clock signal through its own first clock signal CLK input terminal, and each of the even-numbered shift register units receives the second clock signal having an opposite phase to that of the first clock signal through its own second clock signal CLKB input terminal.

Each of the shift register units further includes a first power supply voltage VSS input terminal and a second power supply voltage VDD input terminal for inputting a first power supply voltage and a second power supply voltage respectively, and the first power supply voltage and the second power supply voltage guarantee the normal operation of the shift register units.

In the technical solution of the fourth embodiment of the present disclosure, since a denoise module is newly added in each of the shift register units and removes noise in the signal output from the first output terminal according to the reset control signal and the signal output from the first output terminal, such that denoising the signal output from the first output terminal may be achieved, and thus noise in signals output from the respective shift register units to the corresponding gate lines respectively are reduced, improving display quality of a picture.

Fifth Embodiment

In a fifth embodiment of the present disclosure, there is provided a display device including the gate driver according to the third embodiment or the fourth embodiment.

The above descriptions are only for illustrating the embodiments of the present disclosure, and in no way limit the scope of the present disclosure. It will be obvious that those skilled in the art may make modifications, variations and equivalences to the above embodiments without departing from the spirit and scope of the present disclosure as defined by the following claims. Such variations and modifications are intended to be included within the spirit and scope of the present disclosure.

What is claimed is:

1. A shift register unit comprising:
a pull-up control module for receiving an input signal and outputting a pull-up control signal to a pull-up node;
a pull-up module for providing a signal input from a first clock signal input terminal to a first output terminal according to the pull-up control signal at the pull-up node;
a reset module for providing a first power supply voltage to the pull-up node and the first output terminal according to a reset signal;
a denoise module for holding a signal output from the first output terminal when the signal output from the first output terminal has a level higher than a first preset threshold and outputting the held signal output from the first output terminal from a second output terminal when a signal input from a denoise control signal input terminal has a level higher than a second preset threshold;
wherein the denoise module comprises a seventh transistor and a second capacitor,
the seventh transistor has a control terminal and a first terminal connected together to the first output terminal, and a second terminal connected to a first terminal of the second capacitor; and
a second terminal of the second capacitor is connected to the first power supply voltage.

2. The shift register unit of claim 1, wherein the denoise control signal input terminal is connected to a second clock signal input terminal or a reset control node, a signal input from the second clock signal input terminal has an opposite phase to the signal input from the first clock signal input terminal; the denoise module further comprises a fourteenth transistor, wherein
the fourteenth transistor has a control terminal connected to the denoise control signal input terminal, a first terminal connected to the second terminal of the seventh transistor, and a second terminal connected to the second output terminal.

3. The shift register unit of claim 1, wherein the pull-up control module includes a first transistor, which has a control terminal and a first terminal together receiving the input signal, and a second terminal connected to the pull-up node.

4. The shift register unit of claim 1, wherein the pull-up module comprises a third transistor and a first capacitor, wherein
the third transistor has a control terminal connected to the pull-up node, a first terminal connected to the first clock signal input terminal, and a second terminal connected to the first output terminal; and
the first capacitor has one terminal connected to the pull-up node and the other terminal connected to the first output terminal.

5. The shift register unit of claim 1, further comprising:
a reset control module for outputting a reset control signal to a reset control node according to a second power supply voltage and the pull-up control signal;
wherein the reset module provides the first power supply voltage to the pull-up node and the first output terminal according to the reset signal and the reset control signal.

6. The shift register unit of claim 1, further comprising:
a reset control module for outputting a reset control signal to a reset control node according to a signal input from a second clock signal input terminal and the pull-up control signal;
wherein the reset module provides the first power supply voltage to the pull-up node and the first output terminal according to the signal input from the second clock signal input terminal, the reset signal and the reset control signal.

7. The shift register unit of claim 6, wherein the reset control module comprises: a fifth transistor, a sixth transistor, an eighth transistor and a ninth transistor;
the fifth transistor has a control terminal connected to a second terminal of the ninth transistor, a first terminal connected to the second clock signal input terminal, and a second terminal connected to the reset control node;

the sixth transistor has a control terminal connected to the pull-up node, a first terminal connected to the reset control node, and a second terminal receiving the first power supply voltage;

the eighth transistor has a control terminal connected to the pull-up node, a first terminal connected to the second terminal of the ninth transistor, and a second terminal receiving the first power supply voltage;

the ninth transistor has a control terminal and a first terminal connected together to the second clock signal input terminal.

8. The shift register unit of claim 7, wherein the reset module comprises: a second transistor, a fourth transistor, a tenth transistor, an eleventh transistor, a twelfth transistor and a thirteenth transistor; wherein the second transistor has a control terminal receiving the reset signal, a first terminal connected to the pull-up node, and a second terminal receiving the first power supply voltage;

the fourth transistor has a control terminal receiving the reset signal, a first terminal connected to the first output terminal, and a second terminal receiving the first power supply voltage;

the tenth transistor has a control terminal connected to the reset control node, a first terminal connected to the pull-up node, and a second terminal receiving the first power supply voltage;

the eleventh transistor has a control terminal connected to the reset control node, a first terminal connected to the first output terminal, and a second terminal receiving the first power supply voltage;

the twelfth transistor has a control terminal connected the second clock signal input terminal, a first terminal connected to the first output terminal, and a second terminal receiving the first power supply voltage;

the thirteenth transistor has a control terminal connected to the second clock signal input terminal, a first terminal receiving the input signal, and a second terminal connected to the pull-up node.

9. The shift register unit of claim 5, wherein the reset control module comprises a fifth transistor and a sixth transistor, wherein the fifth transistor has a control terminal and a first terminal together receiving the second power supply voltage, and a second terminal connected to the reset control node;

the sixth transistor has a control terminal connected to the pull-up node, a first terminal connected to the reset control node, and a second terminal receiving the first power supply voltage.

10. The shift register unit of claim 9, wherein the reset module comprises: a second transistor, a fourth transistor, an eighth transistor, a ninth transistor and a tenth transistor, wherein the second transistor has a control terminal connected to the reset control node, a first terminal connected to the pull-up node, and a second terminal receiving the first power supply voltage;

the fourth transistor has a control terminal connected to the reset control node, a first terminal connected to the first output terminal, and a second terminal receiving the first power supply voltage;

the eighth transistor has a control terminal receiving the reset signal, a first terminal receiving the second power supply voltage, and a second terminal connected to the reset control node;

the ninth transistor has a control terminal receiving the reset signal, a first terminal connected to the first output terminal, and a second terminal receiving the first power supply voltage;

the tenth transistor has a control terminal receiving the reset signal, a first terminal connected to the pull-up node, and a second terminal receiving the first power supply voltage.

11. A gate driver including a plurality of shift register units of claim 1, wherein except for a first shift register unit and a last shift register unit, a first output terminal of each of the rest of the shift register units is connected to a reset signal input terminal of its adjacent previous shift register unit and an input terminal of its adjacent next shift register unit, and the gate driver outputs output signals of second output terminals of the respective shift register units sequentially;

a first output terminal of the first shift register unit is connected to an input terminal of a second shift register unit, and a first output terminal of the last shift register unit is connected to a reset signal input terminal of its adjacent previous shift register unit; and an input terminal of the first shift register unit inputs a frame start signal.

12. The gate driver of claim 11, wherein the denoise control signal input terminal is connected to a second clock signal input terminal or a reset control node, a signal input from the second clock signal input terminal has an opposite phase to the signal input from the first clock signal input terminal, the denoise module further comprises: a fourteenth transistor, wherein the fourteenth transistor has a control terminal connected to the denoise control signal input terminal, a first terminal connected to the second terminal of the seventh transistor, and a second terminal connected to the second output terminal.

13. The gate driver of claim 11, wherein the pull-up control module includes a first transistor, which has a control terminal and a first terminal together receiving the input signal, and a second terminal connected to the pull-up node;

the pull-up module comprises a third transistor and a first capacitor, wherein the third transistor has a control terminal connected to the pull-up node, a first terminal connected to the first clock signal input terminal, and a second terminal connected to the first output terminal; and the first capacitor has one terminal connected to the pull-up node and the other terminal connected to the first output terminal.

14. The gate driver of claim 11, wherein the shift register unit further comprises:

a reset control module for outputting a reset control signal to a reset control node according to a second power supply voltage and the pull-up control signal;

wherein the reset module provides the first power supply voltage to the pull-up node and the first output terminal according to the reset signal and the reset control signal.

15. The gate driver of claim 11, wherein the shift register unit further comprises:

a reset control module for outputting a reset control signal to a reset control node according to a signal input from the second clock signal input terminal and the pull-up control signal;

wherein the reset module provides the first power supply voltage to the pull-up node and the first output terminal according to the signal input from the second clock signal input terminal, the reset signal and the reset control signal.

16. The gate driver of claim 15, wherein the reset control module comprises: a fifth transistor, a sixth transistor, an eighth transistor and a ninth transistor;
the fifth transistor has a control terminal connected to a second terminal of the ninth transistor, a first terminal connected to the second clock signal input terminal, and a second terminal connected to the reset control node;
the sixth transistor has a control terminal connected to the pull-up node, a first terminal connected to the reset control node, and a second terminal receiving the first power supply voltage;
the eighth transistor has a control terminal connected to the pull-up node, a first terminal connected to the second terminal of the ninth transistor, and a second terminal receiving the first power supply voltage;
the ninth transistor has a control terminal and a first terminal connected together to the second clock signal input terminal.

17. The gate driver of claim 16, wherein the reset module comprises: a second transistor, a fourth transistor, a tenth transistor, an eleventh transistor, a twelfth transistor and a thirteenth transistor; wherein
the second transistor has a control terminal receiving the reset signal, a first terminal connected to the pull-up node, and a second terminal receiving the first power supply voltage;
the fourth transistor has a control terminal receiving the reset signal, a first terminal connected to the first output terminal, and a second terminal receiving the first power supply voltage;
the tenth transistor has a control terminal connected to the reset control node, a first terminal connected to the pull-up node, and a second terminal receiving the first power supply voltage;
the eleventh transistor has a control terminal connected to the reset control node, a first terminal connected to the first output terminal, and a second terminal receiving the first power supply voltage;
the twelfth transistor has a control terminal connected the second clock signal input terminal, a first terminal connected to the first output terminal, and a second terminal receiving the first power supply voltage;
the thirteenth transistor has a control terminal connected to the second clock signal input terminal, a first terminal receiving the input signal, and a second terminal connected to the pull-up node.

18. The gate driver of claim 14, wherein the reset control module comprises a fifth transistor and a sixth transistor, wherein
the fifth transistor has a control terminal and a first terminal together receiving the second power supply voltage, and a second terminal connected to the reset control node;
the sixth transistor has a control terminal connected to the pull-up node, a first terminal connected to the reset control node, and a second terminal receiving the first power supply voltage.

19. The gate driver of claim 18, wherein the reset module comprises: a second transistor, a fourth transistor, an eighth transistor, a ninth transistor and a tenth transistor, wherein
the second transistor has a control terminal connected to the reset control node, a first terminal connected to the pull-up node, and a second terminal receiving the first power supply voltage;
the fourth transistor has a control terminal connected to the reset control node, a first terminal connected to the first output terminal, and a second terminal receiving the first power supply voltage;
the eighth transistor has a control terminal receiving the reset signal, a first terminal receiving the second power supply voltage, and a second terminal connected to the reset control node;
the ninth transistor has a control terminal receiving the reset signal, a first terminal connected to the first output terminal, and a second terminal receiving the first power supply voltage;
the tenth transistor has a control terminal receiving the reset signal, a first terminal connected to the pull-up node, and a second terminal receiving the first power supply voltage.

20. A display device comprising the gate driver of claim 11.

* * * * *